US007878837B2

(12) United States Patent
Hsieh et al.

(10) Patent No.: US 7,878,837 B2
(45) Date of Patent: Feb. 1, 2011

(54) SOCKET CONNECTOR HAVING IMPROVED ACTUATING MECHANISM FOR DRIVING MOVING PLATE

(75) Inventors: Wen-Yi Hsieh, Tu-Cheng (TW); Ke-Hao Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/702,294

(22) Filed: Feb. 9, 2010

(65) Prior Publication Data
US 2010/0297861 A1 Nov. 25, 2010

(30) Foreign Application Priority Data
May 25, 2009 (CN) .......................... 2009 2 0303516

(51) Int. Cl.
*H01R 13/62* (2006.01)
(52) U.S. Cl. ...................................................... 439/331
(58) Field of Classification Search ................. 439/157, 439/330, 331, 73
See application file for complete search history.

(56) References Cited

U.S. PATENT DOCUMENTS

| 5,037,321 | A | | 8/1991 | Uratsuji et al. |
| 5,578,870 | A | | 11/1996 | Farnsworth et al. |
| 5,807,127 | A | * | 9/1998 | Ohshima ..................... 439/266 |
| 6,280,222 | B1 | * | 8/2001 | Walkup ....................... 439/331 |
| 6,488,522 | B2 | * | 12/2002 | Fukunaga .................... 439/331 |
| 2004/0219818 | A1 | * | 11/2004 | Ye et al. ....................... 439/342 |

* cited by examiner

Primary Examiner—Tho D Ta
Assistant Examiner—Travis Chambers
(74) Attorney, Agent, or Firm—Andrew C. Cheng; Wei Te Chung; Ming Chieh Chang

(57) ABSTRACT

A socket connector includes a socket body, a moving plate movably mounted upon the socket body, and an actuating mechanism. The actuating mechanism comprises a lid, a first operating lever, and a second operating lever. The first and second operating levers are disposed between the lid and moving plate with opposite tilted angles. The first operating lever has a cam section engaged with a bearing section formed on the moving plate so as to drive the moving plate to move in a substantially horizontal direction.

6 Claims, 7 Drawing Sheets

SOCKET CONNECTOR HAVING IMPROVED ACTUATING MECHANISM FOR DRIVING MOVING PLATE

BACKGROUND OF THE INVENTION

1. Field of the Invention

The present invention relates to a socket connector for testing an IC (Integrated Circuit) package, and more particularly to a socket connector having means for driving a moving plate a horizontal direction along an upper surface of a socket body and including an actuating mechanism for driving the moving plate.

2. Description of Prior Art

U.S. Pat. No. 5,037,321 issued to Kazumi et al. on Aug. 6, 1991 discloses a socket connector for testing an IC package comprising a socket body, a moving plate, contact terminals passing through the socket body and the moving plate for making interconnection between the IC package and a circuit board, on which the socket connector is mounted. A lid and a pair of operating levers (6, 7) are provided upon the moving plate, working as means for driving the moving plate to move along a horizontal direction on an upper surface of the socket body. Referring to FIG. 2 and FIG. 3 of Kazumi, each lever is connected to the moving plate via two shafts, that is, a fixed shaft (8, 10) and a translational shaft (9, 11). When the pair of the operating levers is pressed downwardly and pivoted about the fixed shafts respectively, the translational shafts povitably move toward substantially some direction and thereby driving the moving plate to move.

However, because of the pivotable movement of the translational shafts that directly drive the moving plate, it may cause the moving plate to move slantly and is thus likely to damage the contact terminals inserted thereof and break the interconnection between the contact terminals and the IC package.

SUMMARY OF THE INVENTION

It is therefore the object of the present invention to provide a socket connector having an improved actuating mechanism capable of driving a moving plate to move in a substantially horizontal direction.

In accordance with the present invention, a socket connector is provided, which includes a socket body, a moving plate movably mounted upon the socket body, and an actuating mechanism. The actuating mechanism comprises a lid, a first operating lever, and a second operating lever. The first and second operating levers are disposed between the lid and moving plate with opposite tilted angles. The first operating lever has a cam section engaged with a bearing section formed on the moving plate so as to drive the moving plate to move in a substantially horizontal direction.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
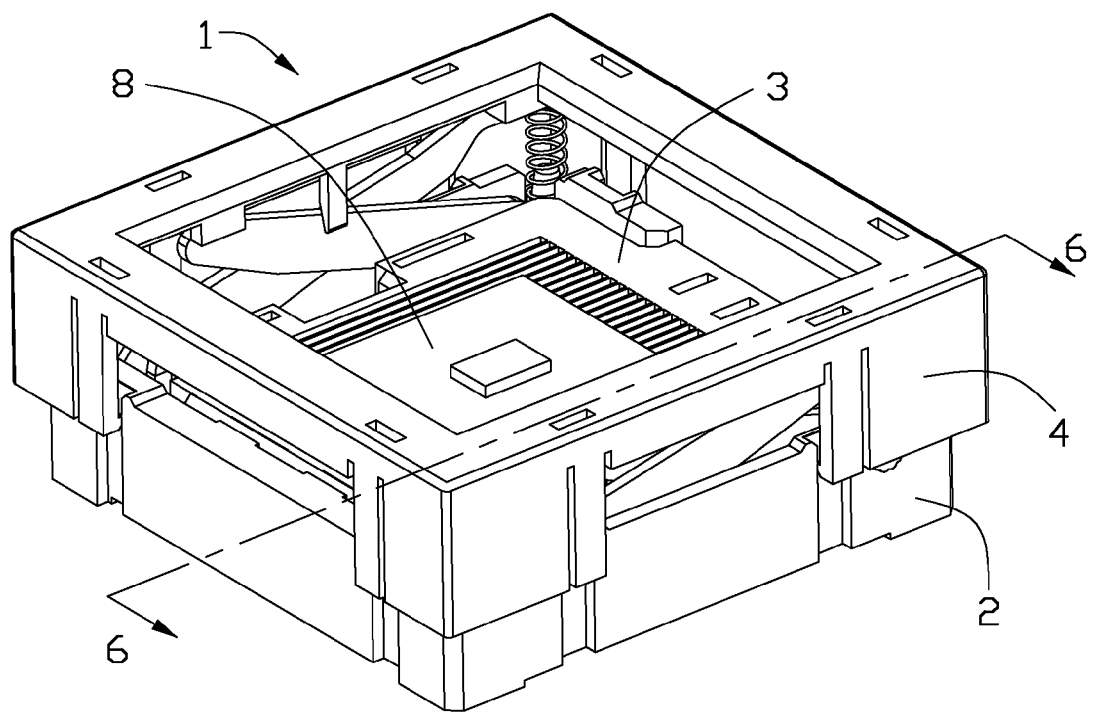
FIG. 1 is an assembled, perspective view of a socket connector in accordance with a preferred embodiment of the present invention.
Figure 2:
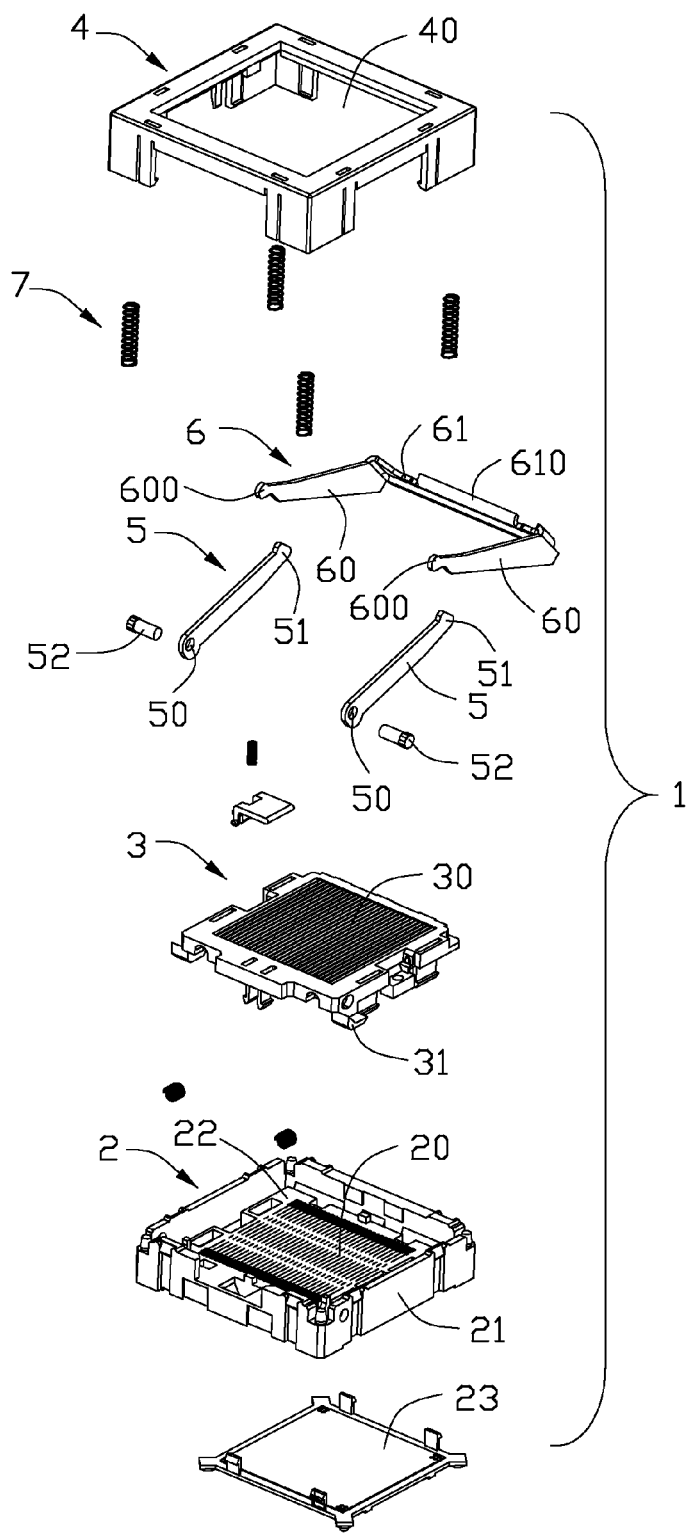
FIG. 2 is an exploded, perspective view of the socket connector in accordance with the preferred embodiment of the present invention.
Figure 3:
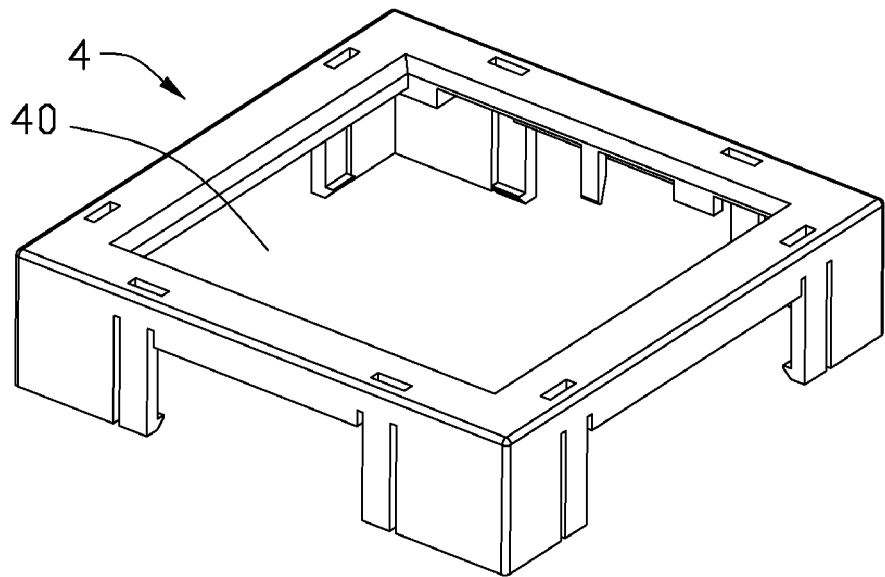
FIG. 3 is an exploded, perspective view of the socket connector with a pair of operating levers assembled onto a moving plate.
Figure 3:
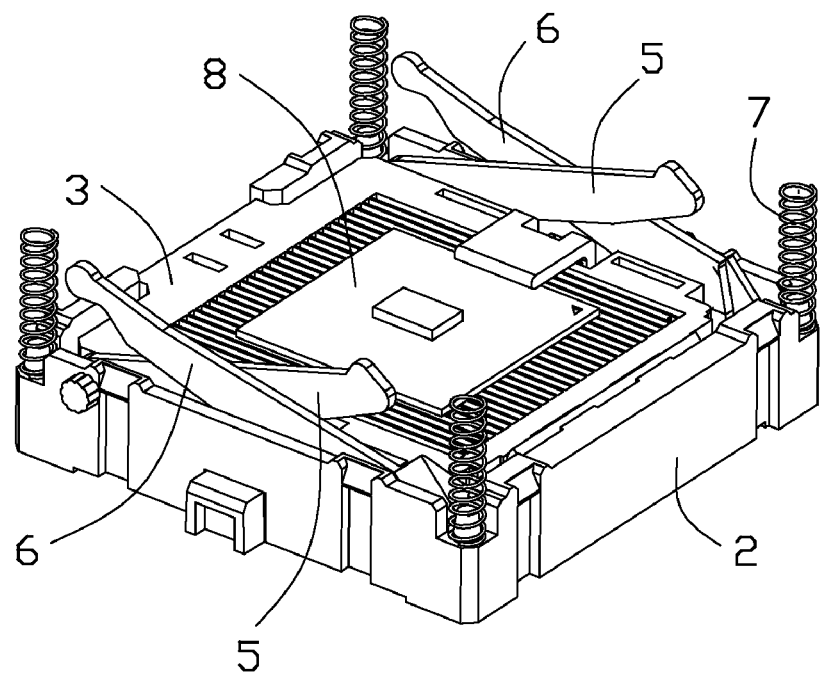
Figure 4:
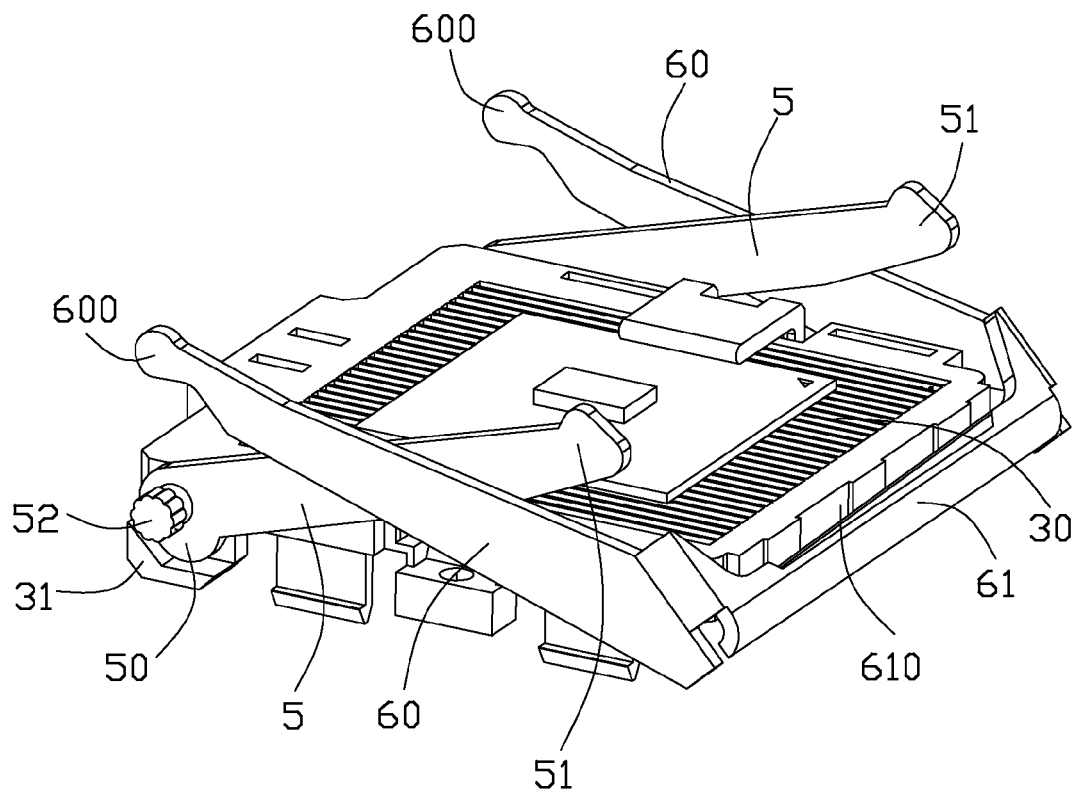
FIG. 4 is an assembled, perspective view of the operating levers and the moving plate.
Figure 5:
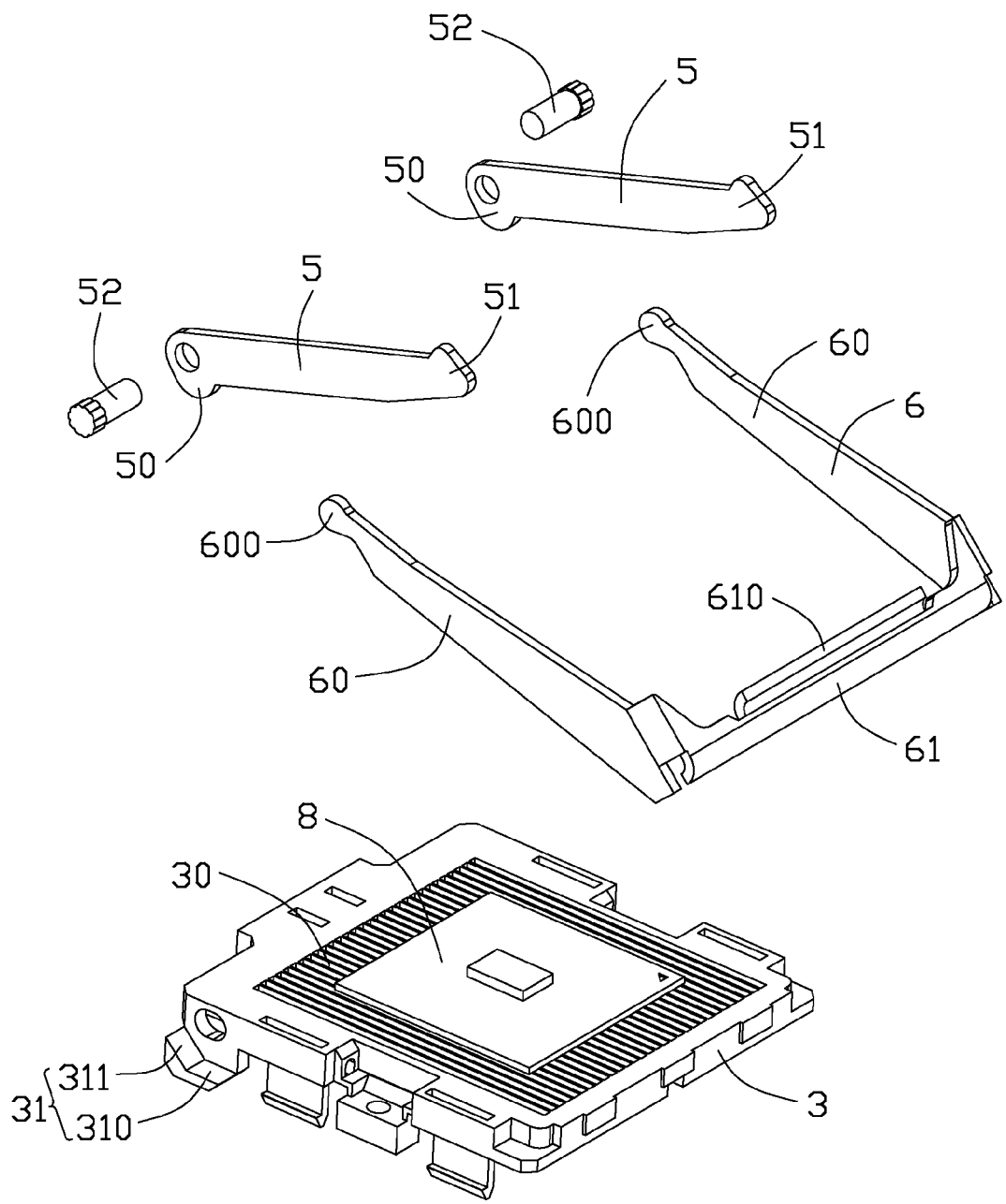
FIG. 5 is an exploded, perspective view of the operating levers and the moving plate.

Referring to FIG. 1 and FIG. 2, a socket connect 1 made in accordance with the present invention is provided for receiving an IC package 8. The socket connector 1 includes a socket body 2, a moving plate 3 movably mounted within the socket 2, a lid 4 mounted above socket body 2. A pair of first operating levers 5 and a U-shaped second operating lever 6 respectively disposed between the lid 4 and moving plate 3. Four springs 7 are provided to be located between the lid 4 and the socket body 2.

The lid 4 is configured with a frame structure and has an opening 40 therein for disposing the IC package 8 therein and remove therefrom after testing. The lid 4 is able to be pressed downwardly against the springs 7 and actuates the operating levers 5, 6, which then move pivotally and drive the moving plate 3 to move along a horizontal direction. And when the lid 4 is released, the lid 4 is returned to a top position via the elastic force released from the compressed springs 7.

In addition, a plurality of contact terminals should be mounted in the socket body 2 and inserted into the moving plate 3. Regarding the working principle of the contact terminals, it can be readily recognized by referring to prior art U.S. Pat. No. 5,037,321 issued to Kazumi et al., which is herein incorporated as reference, and no detailed description is given.

Particularly referring to FIGS. 2-5, the socket body 2 has a base 20 and four sidewalls 21 surrounding the base 20. And a cavity 22 is thus defined to receive the moving plate 3. The dimension of cavity 22 is a bit larger than that of the moving plate 3 so that the moving plate 3 is movable within the cavity 22. The socket body 2 further has a retaining plate 23 attached at the bottom thereof. The moving plate 3 has an upper surface 30 for supporting the IC package 8 and enables the IC package 8 to make interconnection with the contact terminals that inserted through the moving plate 3.

The linear first operating levers 5 are configured with identical structure and each includes a cam section 50 at one end thereof and a first pressing end 51. The first operating lever 5 is disposed with a tilted angle with respect to the moving plate 3 and is hinged to a first end of the moving plate 3 by a shaft 52, which passes through the cam section 50 and is then inserted into the first end of the moving plate 3. The first pressing end 51 is engaged with and able to be pressed by the lid 4. The second operating lever 6 is featured with a substantially U-shaped configuration and includes a pair of lever bars 60 and a pushing bar 61 interconnecting to the lever bars 60. The lever bars 60 are also disposed with a tilted angle opposite to the first levers 5 and each has a second pressing end 600 engaged with and pressed by the lid 4. The pushing bar 61 has an arc pushing section 610 extending upwardly therefrom.

Corresponding to the cam sections 50 of the first operating levers 5, a pair of bearing sections 31 are respectively formed at opposite sides of the moving plate 3 to receive the cam sections 50. Each bearing section 31 includes a planar surface 310 and an inclined surface 311.

Figure 6:
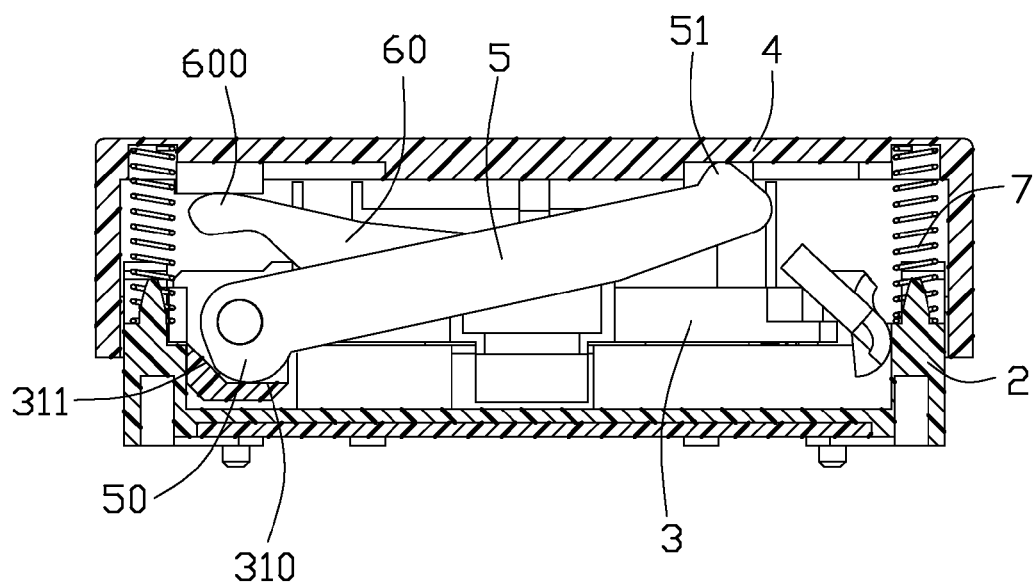
FIG. 6 is a sectional view of the socket connector taken from the line 6-6 of FIG. 1, showing a lid disposed in a top position.
Figure 7:
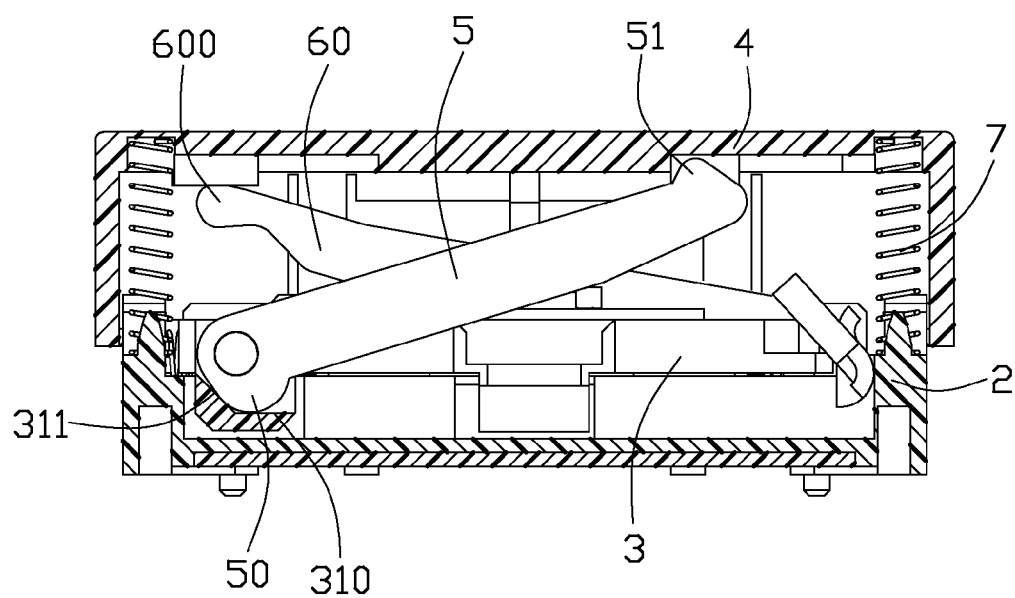
FIG. 7 is a sectional view of the socket connector taken from the line 6-6 of FIG. 1, showing the lid disposed in a low position.

Hereafter is detailed description about the operation and function of the socket connector 1. FIG. 7 shows an initial state of the socket connector 1 in which the lid 4 is located at an upper most position. And particularly referring to FIG. 4 and FIG. 6, when the lid 4 is pressed downwardly against the spring 7, the first and second operating levers 5, 6 pivotally move, respectively clockwise about the shaft 53 and counter-clockwise about the pushing bar 61. The pushing section 610 on the push bar 61 is rotated toward the moving plate 3 and abuts against the moving plate 3. And simultaneously, the cam sections 50 of the first operating levers 5 also rotate toward same lateral direction and abut against the bearing section 31 of the moving plate 3. Thus, the moving plate 3 is driven and moved in a substantially horizontal direction.

Compared to the socket connector disclosed by U.S. Pat. No. 5,037,321, the moving plate of the socket connector of the present invention is able to be moved in substantially horizontal direction without pivot movement such that the interconnection between the contact terminals and the IC package is effectively protected. It should be noted that the instant invention is essentially to make an improvement with regard to U.S. Pat. No. 5,037,321 so that the spring 7 and the lid 4 are essentially accessories thereto wherein understandably the lid 4 and the first and second operating levers 5 and 6 could be joined with each other in a pivotal manner so as to assure co-movement therebetween. On the other hand, the moving plate 3 may also be equipped with the restoration spring so as to assure smoothly back and forth movement of the moving plate 3 in the horizontal direction.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector comprising:
a socket body;
a moving plate movably mounted upon the socket body; and
an actuating mechanism comprising a lid, a first operating lever, and a second operating lever, the first and second operating levers being disposed between the lid and the moving plate with opposite tilted angles; wherein
the first operating lever has a cam section engaged with a bearing section formed on the moving plate so as to drive the moving plate to move in a substantially horizontal direction wherein the second operating lever features U-shaped configuration and comprises a pair of lever bars and a pushing bar interconnecting the lever bars; wherein the pushing bar has a pushing section abutting against the moving plate when the second lever pivotally moves.

2. The socket connector as claimed in claim 1, wherein the first operating lever is hinged to the moving plate and a shaft is provided to pass through the cam section and is then inserted into the moving plate.

3. The socket connector as claimed in claim 1, wherein the bearing section comprises a planar surface and an inclined surface, the cam section of the first operating lever abutting against the inclined surface when the first operating lever pivotally moves.

4. A socket connector for an IC package comprising:
a socket body;
a moving plate movably mounted upon the socket body;
a pair of first operating levers located by opposite sides of the moving plate with a tilted angle with respect thereto and associated with the moving plate;
a second operating levers located opposite to the first operating levers with a tilted angle with respect to the moving plate and associated with the moving plate; and
a lid movably mounted above the socket body and engaged with the first and second operating levers such that when the lid is pressed downwardly, the first and second operating levers push the moving plate and enable the moving plate to move in a substantially horizontal direction wherein the second operating lever is formed to be U-shaped configuration and comprises a pushing section capable of pushing the moving plate from a longitudinal edge thereof.

5. The socket connector as claimed in claim 4, wherein the first operating lever has a cam section and the moving plate has a bearing section engaged with the operating lever.

6. The socket connector as claimed in claim 5, wherein the bearing section comprises a planar surface and an inclined surface, the cam section of the first operating lever abutting against the inclined surface when the first operating lever pivotally moves.

* * * * *